(12) United States Patent
Ishizuka et al.

(10) Patent No.: US 8,523,391 B2
(45) Date of Patent: Sep. 3, 2013

(54) FLAT LIGHT SOURCE APPARATUS WITH SEPARABLE UNIT BOARDS

(75) Inventors: Masahiro Ishizuka, Shinagawa-ku (JP); Katsuyuki Okimura, Shinagawa-ku (JP); Yoshinori Ueji, Shinagawa-ku (JP); Ryuichiro Morinaka, Shinagawa-ku (JP); Naoki Tatsumi, Shinagawa-ku (JP); Tomoyuki Fukuda, Shinagawa-ku (JP)

(73) Assignee: NEC Corporation, Tokyo (JP)

( * ) Notice: Subject to any disclaimer, the term of this patent is extended or adjusted under 35 U.S.C. 154(b) by 1816 days.

(21) Appl. No.: 11/346,388

(22) Filed: Feb. 3, 2006

(65) Prior Publication Data

US 2006/0221608 A1    Oct. 5, 2006

(30) Foreign Application Priority Data

Feb. 10, 2005   (JP) ................................ 2005-034302

(51) Int. Cl.
*H05K 1/14*    (2006.01)
(52) U.S. Cl.
USPC ...... 362/249.02; 362/225; 362/800; 361/792; 361/785
(58) Field of Classification Search
USPC ........................ 362/249, 225; 361/792, 785
See application file for complete search history.

(56) References Cited

U.S. PATENT DOCUMENTS

| | | | | |
|---|---|---|---|---|
| 6,422,716 B2 * | 7/2002 | Henrici et al. | ................ | 362/249 |
| 6,558,021 B2 * | 5/2003 | Wu et al. | ................ | 362/249 |
| 6,851,831 B2 * | 2/2005 | Karlicek, Jr. | ................ | 362/249 |
| 6,942,360 B2 * | 9/2005 | Chou et al. | ................ | 362/238 |
| 7,008,080 B2 * | 3/2006 | Bachl et al. | ................ | 362/249 |
| 7,322,718 B2 * | 1/2008 | Setomoto et al. | ............. | 362/276 |

FOREIGN PATENT DOCUMENTS

| | | |
|---|---|---|
| JP | 57-178488 | 7/1956 |
| JP | 2003-100108 A | 4/2003 |
| JP | 2003-168305 A | 6/2003 |

* cited by examiner

*Primary Examiner* — Jong-Suk (James) Lee
*Assistant Examiner* — Leah S Macchiarolo
(74) *Attorney, Agent, or Firm* — Sughrue Mion, PLLC

(57) ABSTRACT

A flat light source apparatus has a light source board which comprises unit boards, each unit board having a printed circuit board and a light source formed on the printed circuit board, wherein the unit boards are arranged adjacent to each other at least in one direction, and any pair of the unit boards adjacent to each other is integrated by a connecting portion provided therebetween. The apparatus also has a main wire which extends along a plane of the light source board, wherein the main wire extends between adjacent unit boards via the connecting portion such that all of the unit boards are electrically connected to each other by the main wire. The apparatus further has a branch wire for supplying electric power to the light source, the branch wire being provided in each unit board and branching from the main wire in each unit board.

20 Claims, 5 Drawing Sheets

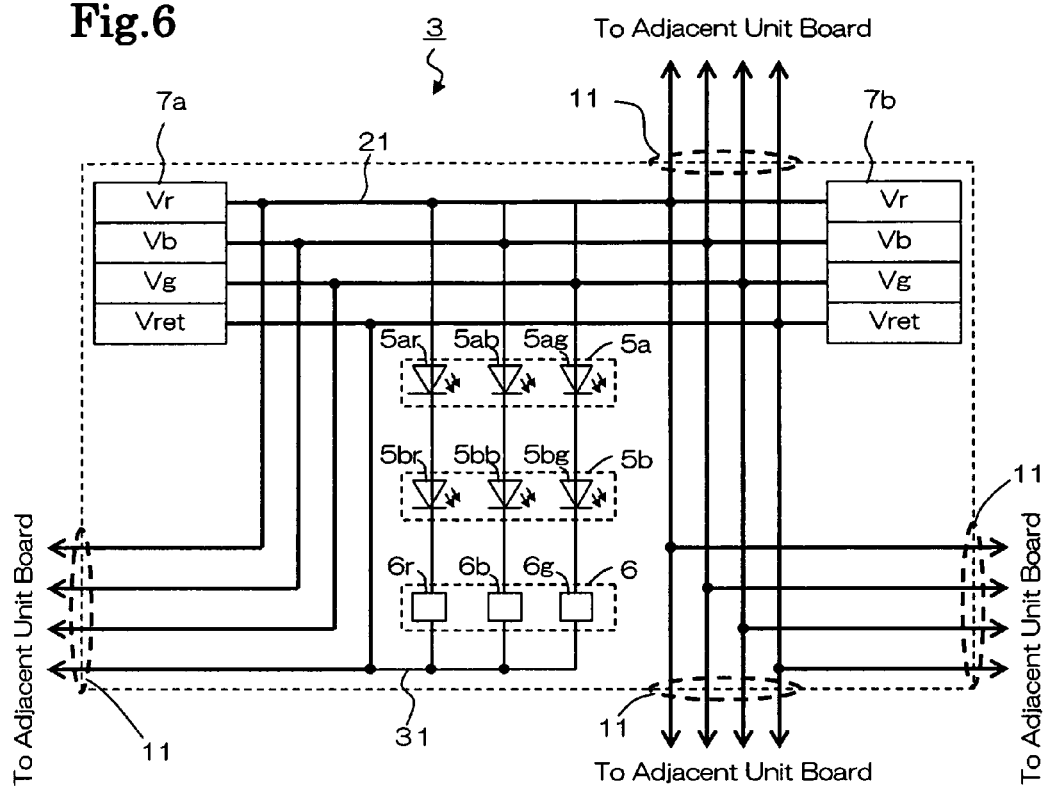

FLAT LIGHT SOURCE APPARATUS WITH SEPARABLE UNIT BOARDS

BACKGROUND OF THE INVENTION

1. Field of the Invention

The present invention relates to a flat light source apparatus, particularly to a flat light source apparatus with self-luminous light sources such as light emitting diodes.

2. Description of the Related Art

Flat light source apparatuses are widely used for applications which need uniform illuminance distribution. Flat light sources using self-luminous light sources, such as light emitting diodes, have already been put in practical use as well. Each element of a flat light source, which constitutes a flat light source apparatus, is usually formed in a predetermined shape, such as a strip shape like a rectangle like or a square. However, since the area which receives a flat light source apparatus is determined in advance, depending on applications, the flat light source apparatus is manufactured in a desired shape by combining the elements in the predetermined shape, mentioned above, into the desired shape, and by electrically connecting the elements.

Thus, the drawback in prior art is that there is limited flexibility in the shapes that can be used to assemble a flat light source apparatus because the flat light source apparatus has to be formed into the desired shape by combining elements that have a predetermined shape. Moreover, the resultant electric wiring requires complicated work, which necessitates improving manufacturing efficiency.

SUMMARY OF THE INVENTION

The object of the present invention is to provide a flat light source apparatus which can easily be formed in a desired shape and which operates with minimum electric wiring.

A flat light source apparatus according to the present invention has a light source board which comprises a plurality of unit boards, each unit board having a printed circuit board and a light source formed on the printed circuit board, wherein the plurality of unit boards are arranged adjacent to each other at least in one direction, and any pair of the unit boards adjacent to each other is integrated by a connecting portion provided therebetween. The apparatus also has at least one main wire which extends along a plane of the light source board, wherein the at least one main wire extends between the adjacent unit boards via the connecting portion such that all of the unit boards are electrically connected to each other by the at least one main wire. The apparatus further has at least one branch wire for supplying electric power to the light source, the at least one branch being provided in each unit board and branching from the main wire in each unit board.

In such a flat light source apparatus, each unit board only needs to be integrated by the connecting portion, and there are no limitations as to how the unit boards are combined. Therefore, a flat light source apparatus can be easily manufactured in a desired shape, based on the shape of the area which receives the apparatus. Further, since all unit boards are connected by main wires, wiring work between unit boards is not required. Accordingly, a flat light source apparatus can be provided which can be easily manufactured in a desired shape and can operate with minimum electric wiring.

A method for manufacturing a flat light source apparatus according to the present invention has the steps of: preparing an assembly of flat light sources, wherein the assembly comprises: a light source board which comprises a plurality of unit boards, each unit board having a printed circuit board and a light source formed on the printed circuit board, wherein the plurality of unit boards are arranged adjacent to each other at least in one direction, and any pair of the unit boards adjacent to each other is integrated by a connecting portion provided therebetween; at least one main wire which extends along a plane of the light source board, wherein the at least one main wire extends between adjacent unit boards via the connecting portion such that all of the unit boards are electrically connected to each other by the at least one main wire; and at least one branch wire for supplying electric power to the light source, the at least one branch being provided in each unit board and branching from the main wire in each unit board; cutting the assembly along at least one connecting portion; and connecting a power supply to one of the main wires.

An assembly of flat light sources according to the present invention has a plurality of unit boards, each unit board having a printed circuit board and a light source formed on the printed circuit board, wherein the plurality of unit boards are arranged adjacent to each other at least in one direction, and any pair of the unit boards adjacent to each other is integrated by a connecting portion provided therebetween. The assembly also has at least one main wire which extends along a plane of the light source board, wherein the at least one main wire extends between adjacent unit boards via the connecting portion such that all of the unit boards are electrically connected to each other by the at least one main wire. The assembly further has at least one branch wire for supplying electric power to the light source, the at least one branch being provided in each unit board and branching from the main wire in each unit board.

The above and other objects, features and advantages of the present invention will become apparent from the following description with reference to the accompanying drawings which illustrate examples of the present invention.

BRIEF DESCRIPTION OF THE DRAWINGS

FIG. 6 is a detailed circuit diagram of a unit board; and

DETAILED DESCRIPTION OF THE INVENTION

The flat light source apparatus of the present invention can be used in a wide range of applications which need a flat light source, such as general lighting, signboards, display boards, and back lights for non-luminous display devices etc. Embodiments of the flat light source apparatus of the present invention will be explained in detail with reference to the attached drawings.

Figure 1:
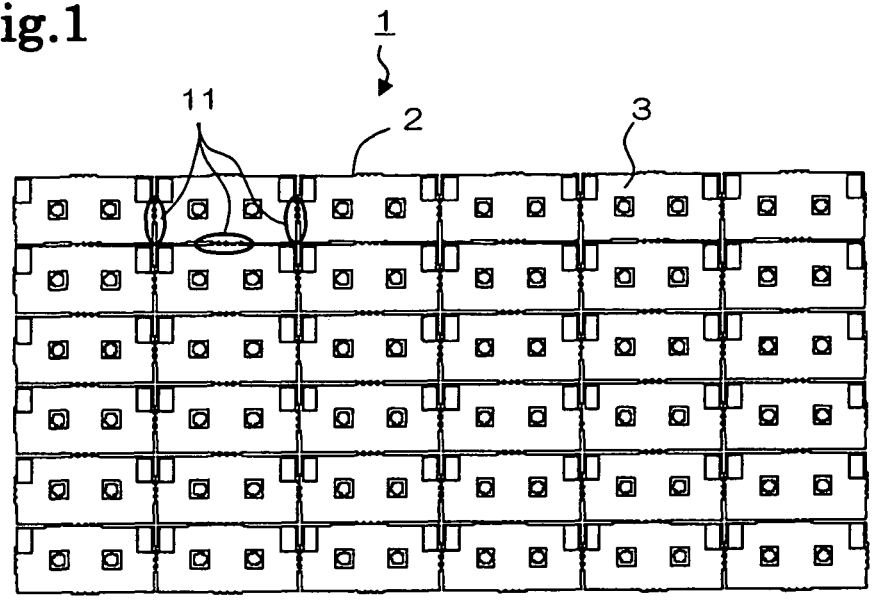
FIG. 1 is a plan view of a flat light source apparatus of the present invention.

FIG. 1 shows a plan view of a flat light source apparatus. Flat light source apparatus 1 has light source board 2 in the shape of a sheet. Light source board 2, which is a circuit board having light sources, has a plurality of unit boards 3 which are arranged in a form of a lattice, and are integrated by connecting portions 11.

Figure 2:
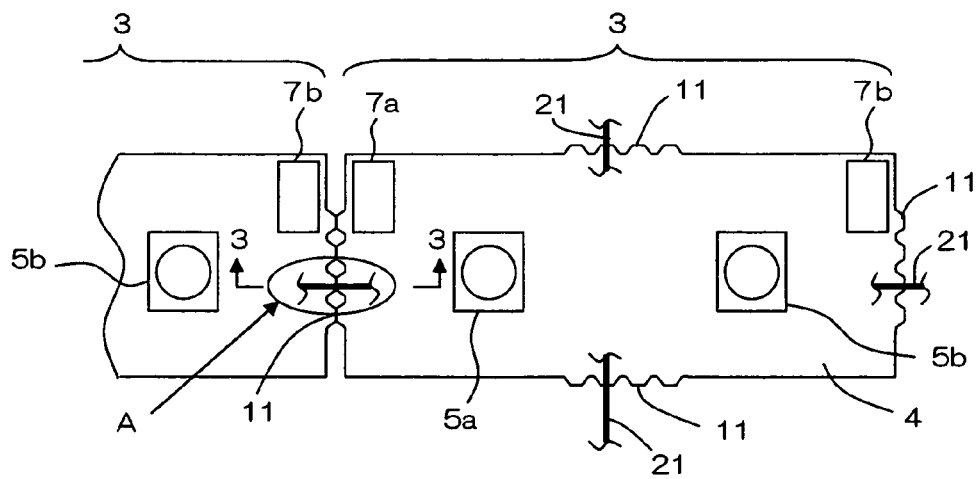
FIG. 2 is a partial enlarged plan view of the flat light source apparatus shown in FIG. 1.

FIG. 2 shows a partial enlarged plan view of the flat light source apparatus shown in FIG. 1. Unit board 3 has printed circuit board 4, and light sources 5a, 5b, constant current circuit 6, shown in FIG. 6, and connectors 7a, 7b are formed on printed circuit board 4. Main wires 21 which connect unit boards 3 extend via connecting portions 11. The aspect ratio of unit board 3 is, but not limited to, approximately 1:2 in this embodiment. Flat light source apparatus 1 can be formed in a desired aspect ratio by adjusting the number of unit boards 3 in each direction, as will be described later. Flat light source apparatus 1 can also be formed in a shape other than a rectangle. Light sources 5a, 5b, constant current circuit 6, and connectors 7a, 7b may also be formed on both sides of printed circuit board 4. Light sources 5a, 5b, constant current circuit 6, and connectors 7a, 7b are preferably arranged in locations common to each unit board 3.

In this embodiment, light sources 5a, 5b are full color type light emitting diodes consisting of three color, i.e., red, green, and blue, integrated diodes. However, a light source may have a monochromatic or white color. Unit board 3 may have one light source, or three or more light sources. A wide variety of self-luminous light sources, such as an electroluminescence (EL) panel or a small electric bulb, as well as a light emitting diode, may also be used as a light source.

Connectors 7a, 7b are used for terminals to supply electric power to light sources 5a, 5b from DC power supply 41 (See FIG. 5) which is provided outside of light source board 2. Two connectors are provided in the circumferential region of each unit board 3. However, one connector or three or more connectors may be provided.

Figure 3:
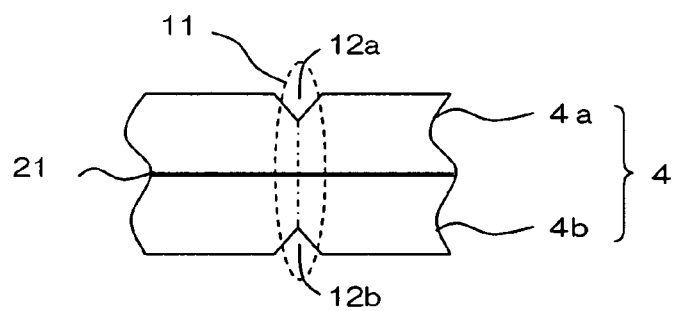
FIG. 3 is a sectional view of the flat light source apparatus taken along line 3-3 of FIG. 2.

Referring to FIG. 3, printed circuit board 4 of unit board 3 has a laminated structure consisting of upper printed circuit board 4a and lower printed circuit board 4b, with main wires 21 interposed therebetween. Upper printed circuit board 4a and lower printed circuit board 4b are preferably made of materials with high heat dissipation characteristics, such as a metal core base, or a metal plate with a laminated insulator, aluminum nitride, ceramics, and the like. However, conventional materials for a printed circuit board, such as phenolic paper or glass epoxy may be used as well. Although not shown in the figure, branch wires 31, which will be described later, are also formed between upper printed circuit board 4a and lower printed circuit board 4b. Main wires 21 and branch wires 31 may have a multilayer structure so that the wires for each color and for the ground, which will be described later, are separated from each other. Upper printed circuit board 4a and lower printed circuit board 4b are provided with notches 12a, 12b in connecting portion 11, respectively.

Figure 4:
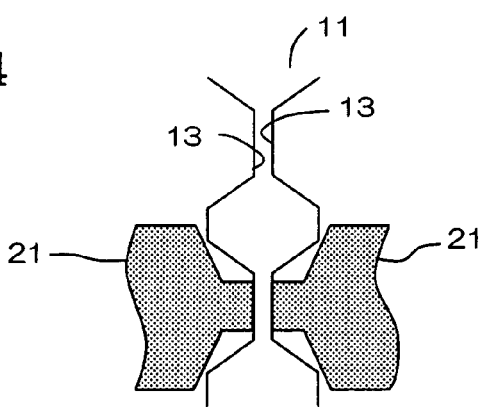
FIG. 4 is a partial plan view of a connecting portion.

FIG. 4 is a partial plan view of a connecting portion. Although the connecting portion is depicted such that the adjacent unit boards are separated from each other for illustrating purposes, the adjacent unit boards are integrated at connecting portion 11 by a plurality of protrusions 13 which extend from each circumferential region of unit boards 3 which are adjacent to each other. Main wires 21 are connected via connecting portion 11 to extend therethrough. Main wires 21 are tapered at connecting portion 11 in accordance with the shape of protrusion 13.

Notches 12a, 12b are formed in connecting portion 11, and adjacent unit boards 3 are connected only by protrusions 13. Therefore, connecting portions 11 have a smaller section area than the other parts of printed circuit board 4, and the resistance of connecting portion 11 to cutting is reduced in accordance with the section area. Thus, unit boards 3 can be easily cut apart at connecting portion 11, as will be described later.

Figure 5:
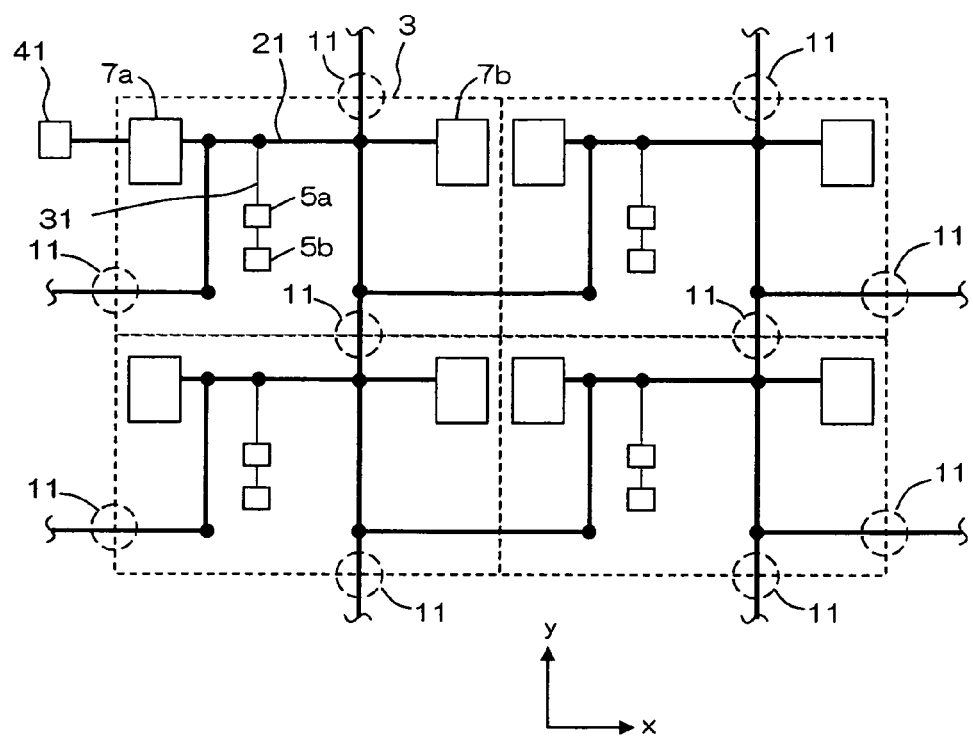
FIG. 5 is a schematic circuit diagram of a flat light source apparatus.

Next, the circuitry of flat light source apparatus 1 will be explained in detail with reference to the drawings. FIG. 5 shows a schematic circuit diagram of a flat light source apparatus, and FIG. 6 shows a detailed circuit diagram of a unit board. In FIG. 5, the main wires and the branch wires in each light source are represented by single lines, and the ground wires are omitted. In FIGS. 5 and 6, main wires 21 are represented by bold lines, while branch wires 31 are represented by thin lines.

Referring to FIG. 5, main wires 21 extend in two directions along the sides of unit board 3 and perpendicularly to each other, i.e., in x and y directions shown in the figure, in light source board 2 or in each unit board 3. Main wires 21 extend through unit boards 3 in x and y directions via connecting portions 11, shown by dashed circle lines. Main wires 21 extending in x direction and in y direction are electrically connected at the intersections. This configuration allows all of unit boards 3 to be electrically connected through main wires 21. Main wires 21 extending in x direction are detoured in order to avoid interference with light sources 5a, 5b, but may be routed straight.

Main wire 21 in each unit board 3 is connected with connectors 7a, 7b in the unit board. Although connectors 7a, 7b are connected with main wire 21 extending in the x direction in this embodiment, they may be connected with main wire 21 extending in the y direction. DC power supply 41 is connected to either of the connectors in any of unit boards 3 which constitute light source board 2, for example to connector 7a in upper left unit board 3 in FIG. 5. DC power supply 41 controls the color duty of each light source through a Pulse Width Modulation circuit.

Branch wire 31, which branches from main wire 21 within each unit board 3, supplies electric power for driving light sources 5a, 5b. Light sources 5a, 5b may be connected in series, as shown in FIGS. 5 and 6, or in parallel. Referring to FIG. 6, light source 5a has first red light source 5ar, first blue light source 5ab, and first green light source 5ag. Light source 5b has second red light source 5br, second blue light source 5bb, and second green light source 5bg.

Constant current circuit 6, which stably supplies current in predetermined magnitude to light sources 5a, 5b, consists of circuits for lighting the light sources, such as a feedback circuit. Specifically, constant current circuit 6 has constant current circuit 6r for red light source which controls first and second red light source 5ar, 5br, constant current circuit 6b for blue light source which controls first and the second blue light source 5ab, 5bb, and constant current circuit 6g for green light source which control first and second green light source 5ag, 5bg.

Each connector 7a, 7b has terminal Vr for red light, terminal Vb for blue light, terminal Vg for green light, and ground terminal Vret. Terminal Vr for red light is connected to the anode side of first red light source 5ar in each unit board 3 via main wires 21 for red light and via branch wire 31 for red light. First red light source 5ar is connected to second red light source 5br on the downstream side, and second red light source 5br is further connected to constant current circuit for red light source 6r on the downstream side. Constant current circuit for red light source 6r is connected to ground terminal Vret via branch wire 31 and main wires 21 for grounding. The blue light source and the green light source are also provided with the same configuration.

The flat light source of the present invention is not limited to the configuration mentioned above. For example, the main wires and/or the branch wires may be formed on the surface of a printed circuit board, that is on the front surface or the rear surface or on both of them, instead of being formed between upper printed circuit board 4a and lower printed circuit board 4b. In other words, a printed circuit board does not need to have a multilayer configuration. A printed circuit board may be made of a flexible material such as a flexible circuit board as well as a hard material. In this case, the printed circuit board may be cut apart with scissors, for example, along dotted lines which are formed in advance in order to separate the assembly of flat light sources, as will be described later.

Figure 7A:
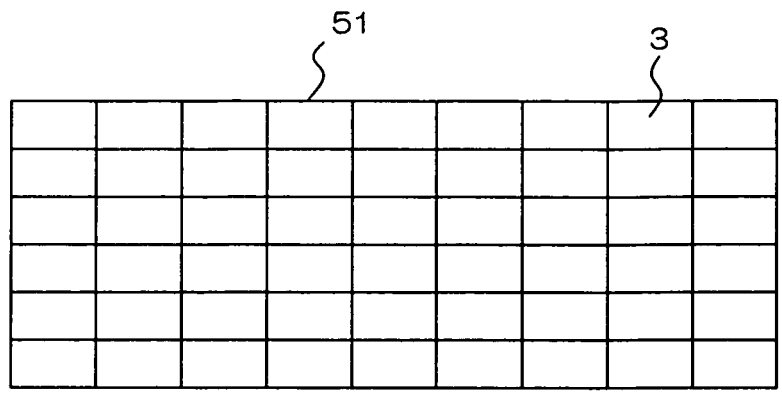
FIGS. 7A-7C are diagrams showing a method for manufacturing a flat light source apparatus.

Next, referring to FIGS. 7A-7C, a method for manufacturing a flat light source apparatus in a desired shape will be explained. First, as shown in FIG. 7A, assembly of flat light sources 51 that is larger than the area that receives flat light source apparatus 1 is prepared. Assembly 51 has light source board 2 which comprises a plurality of unit boards 3. Each of unit boards 3 has printed circuit board 4 and light sources 5a, 5b formed on the printed circuit board. A plurality of unit boards 3 are arranged adjacent to each other in at least one direction, and any pair of unit boards 3 adjacent to each other is integrated by connecting portion 11 provided therebetween. Assembly 51 also has at least one main wire 21 which extends along a plane of light source board 2. Main wire 21 extends between adjacent unit boards 3 via connecting portion 11 such that all of unit boards 3 are electrically connected to each other by main wire 21. Assembly 51 further has at least one branch wire 31 for supplying electric power to light sources 5a, 5b. Branch wire 31 is provided in each unit board 3 and branches from main wire 21 in each unit board 3.

Figure 7B:
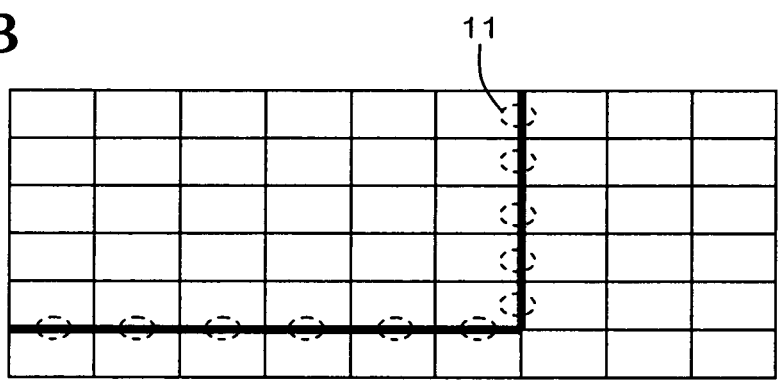
Figure 7C:
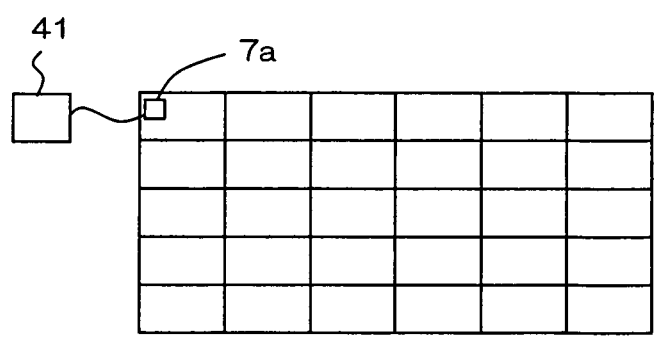

Next, as shown in FIG. 7B, assembly of flat light sources 51 is cut into a shape and a dimension that is similar to the area that receives flat light source apparatus 1. If the area that receives light source apparatus 1 is represented by the bold lines in the figure, connecting portions 11 shown by the dashed circle line will be cut. Next, as shown in FIG. 7C, DC power supply 41 is connected to one of the connectors. As will be apparent from the above-mentioned explanation, DC power supply 41 can be connected to any of unit boards 3, because all of unit boards 3 are electrically connected to each other. However, in general, DC power supply 41 is preferably connected to one of the connectors which face the circumferential region of assembly of flat light sources 51 which was cut. Thus, it is ensured that all of unit boards 3 are electrically connected to each other, irrespective of the shape into which assembly of flat light sources 51 is cut.

In addition, it is also possible to divide assembly of flat light sources 51 into a plurality of unit boards 3 to use each unit board 3 as an independent flat light source apparatus. It is also possible to divide assembly of flat light source 51 into two or more light source boards 2, or to form two or more light source boards 2 from two or more assemblies of flat light sources 51, and then to combine the light source boards to form a single flat light source apparatus. Such a configuration can be applied to a flat light source apparatus having light source boards 2 which are spaced apart. In this case, light source boards 2 can be electrically connected with each other by electrically connecting at least one connector of each light source board 2 in an appropriate manner.

Next, a method for controlling the above-mentioned flat light source apparatus 1 will be explained. In order to turn on all the light sources of red, blue, and green, DC current is supplied to all the terminals, i.e., terminal Vr for red light, terminal Vb for blue light, and terminal Vg for green light, and ground terminal Vret. All light sources 5a, 5b which are connected to the unit boards are turned on, and blink control is provided by turning the DC current ON/OFF.

In order to turn on only red light sources, DC current is supplied only between terminal Vr for red light and ground terminal Vret. First red light source 5ar and second red light source 5br are turned on, and blink control is provided turning the DC current ON/OFF. A similar connection is made in order to turn on only blue light sources or only green light sources. In order to turn on red light sources and blue light sources, or blue light sources and green light sources, or green light sources and red light sources, DC current is supplied only to the light sources which are to be turned on.

In order to control the illuminance of red light, DC current is supplied between terminal Vr for red light and ground terminal Vret under the operation of a PWM circuit that controls the duty ratio. In order to control the illuminance of blue light, DC current is supplied between terminal Vb for blue light and ground terminal Vret under the operation of the PWM circuit. In order to control the illuminance of green light, DC current is supplied between terminal Vg for green light and ground terminal Vret under the operation of the PWM circuit. All of light sources 5a, 5b are operated according to the duty ratio to control the illuminance of each color light. The number of unit boards may be varied according to the capacity of the power supply in order to control the illuminance. Alternatively, in addition to using a PWM circuit to control the power supply, another system may be used to directly control the constant current circuit as a way to control the lighting of light sources.

The advantages of the present invention will be summarized as follows. First, a flat light source apparatus of the present invention can be fabricated in a desired shape by dividing a sheet-like assembly of flat light sources into specified shapes. Specifically, since an assembly of flat light sources is made from a set of a plurality of unit boards which can be easily cut apart, a flat light source apparatus can be manufactured by cutting connecting portions at desired locations in accordance with the shape of the area which receives the apparatus, thus permitting wide flexibility in determining shapes. Secondly, since unit boards are connected to each other via main wires which thus ensures that all unit boards is electrically connected irrespective of the shape into which an assembly is cut, internal electrical connection between unit boards is not required. An external power supply only needs to be connected to one unit board, resulting in a limited amount of wiring work. This contributes not only to an improvement in manufacturing efficiency, but also to an improvement in the reliability of the wiring. Thirdly, since connecting portions are configured to be easily cut, the effort that is required to cut an assembly into a desired shape is easily performed. Furthermore, since each unit board constituting an assembly of flat light sources has the same configuration, manufacturing of an assembly, as well as assemblies in different sizes can be simplified.

Although certain preferred embodiments of the present invention have been shown and described in detail, it should be understood that various changes and modifications may be made without departing from the spirit or scope of the appended claims.

What is claimed is:
1. A flat light source apparatus comprising:
a light source board which comprises a plurality of unit boards, each unit board having a printed circuit board and a light source formed on the printed circuit board, wherein said plurality of unit boards are arranged adjacent to each other at least in one direction, and any pair of the unit boards adjacent to each other is integrated by a connecting portion provided therebetween;
at least one main wire which extends along a plane of the light source board, wherein said at least one main wire extends between adjacent unit boards via the connecting portion such that all of the unit boards are electrically connected to each other by said at least one main wire; and at least one branch wire for supplying electric power to the light source, said at least one branch wire being provided in each unit board and branching from the main wire in each unit board, wherein the adjacent unit boards and the connecting portion are a monolithic structure.

2. The flat light source apparatus according to claim 1, wherein said plurality of unit boards are arranged adjacent to each other in a form of a lattice.

3. The flat light source apparatus according to claim 1, wherein at least one unit board is provided with a connector that is connected to the main wire to receive electric power.

4. The flat light source apparatus according to claim 3, wherein each unit board is provided with the connector at a location that is common to each unit board.

5. The flat light source apparatus according to claim 3, wherein each unit board is provided with the connectors at two locations which are common to each unit board.

6. The flat light source apparatus according to claim 3, further comprising a power supply unit for generating electric power, the power supply unit being connected to the connector.

7. The flat light source apparatus according to claim 1, wherein the connecting portion is less resistant to cutting than the unit board.

8. The flat light source apparatus according to claim 7, wherein the connecting portion has a smaller thickness than the unit board.

9. The flat light source apparatus according to claim 1, wherein the light source has a set of light sources of different colors, and the main wire and the branch wire are provided for each color.

10. The flat light source apparatus according to claim 1, wherein the light source is a light emitting diode.

11. The flat light source apparatus according to claim 1, wherein the at least one main wire further extends into a first side of a first unit board among said plurality of unit boards to a second side, that is different from the first side, of the first unit board.

12. The flat light source apparatus according to claim 1, wherein the adjacent unit boards are integrated at the connecting portions by a plurality of protrusions which extend from a circumferential region of the unit boards and the adjacent unit boards are connected by the plurality of protrusions.

13. The flat light source apparatus according to claim 12, wherein the at least one main wire extends through the protrusions which extend from the unit boards.

14. The flat light source apparatus according to claim 1, wherein the printed circuit board of the unit boards comprise:
an upper printed circuit board; and
a lower printed circuit board,
wherein the at least one main wire is interposed between the upper and the lower printed circuit board.

15. The flat light source apparatus according to claim 1, wherein the at least one main wire comprises at least two main wires, wherein a first main wire extends along a first side of the unit boards perpendicular to a second main wire which extends along a second side of the unit boards.

16. The flat light source apparatus according to claim 1, wherein the at least one main wire extends along the entire length of the unit board and extends through the connecting portion.

17. The flat light source apparatus according to claim 1, wherein the connecting portions have notches provided thereon.

18. The flat light source apparatus according to claim 1, wherein the printed circuit board is made of a flexible material and a hard material.

19. A method for manufacturing a flat light source apparatus comprising the steps of:
preparing an assembly of flat light sources, wherein the assembly comprises:
a light source board which comprises a plurality of unit boards, each unit board having a printed circuit board and a light source formed on the printed circuit board, wherein said plurality of unit boards are arranged adjacent to each other at least in one direction, and any pair of the unit boards adjacent to each other is integrated by a connecting portion provided therebetween; at least one main wire which extends along a plane of the light source board, wherein said at least one main wire extends between adjacent unit boards via the connecting portion such that all of the unit boards are electrically connected to each other by said at least one main wire; and at least one branch wire for supplying electric power to the light source, said at least one branch wire being provided in each unit board and branching from the main wire in each unit board;
cutting the assembly along at least one connecting portion; and
connecting a power supply to one of the main wires,
wherein the adjacent unit boards and the connecting portion are a monolithic structure.

20. An assembly of flat light sources comprising:
a light source board which comprises a plurality of unit boards, each unit board having a printed circuit board and a light source formed on the printed circuit board, wherein said plurality of unit boards are arranged adjacent to each other at least in one direction, and any pair of the unit boards adjacent to each other is integrated by a connecting portion provided therebetween;
at least one main wire which extends along a plane of the light source board, wherein said at least one main wire extends between adjacent unit boards via the connecting portion such that all of the unit boards are electrically connected to each other by said at least one main wire; and
at least one branch wire for supplying electric power to the light source, said at least one branch wire being provided in each unit board and branching from the main wire in each unit board,
wherein the adjacent unit boards and the connecting portion are a monolithic structure.

* * * * *